(12) United States Patent
Ye

(10) Patent No.: US 11,056,580 B2
(45) Date of Patent: Jul. 6, 2021

(54) SEMICONDUCTOR DEVICE AND MANUFACTURING METHOD THEREOF

(71) Applicant: INSTITUTE OF MICROELECTRONICS, CHINESE ACADEMY OF SCIENCES, Chaoyang District (CN)

(72) Inventor: Tianchun Ye, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/757,601

(22) PCT Filed: Nov. 23, 2015

(86) PCT No.: PCT/CN2015/095247
§ 371 (c)(1),
(2) Date: Mar. 5, 2018

(87) PCT Pub. No.: WO2017/035959
PCT Pub. Date: Mar. 9, 2017

(65) Prior Publication Data
US 2018/0248022 A1    Aug. 30, 2018

(30) Foreign Application Priority Data

Sep. 6, 2015 (CN) .......................... 201510560954.2

(51) Int. Cl.
*H01L 21/02* (2006.01)
*H01L 29/66* (2006.01)
(Continued)

(52) U.S. Cl.
CPC .... *H01L 29/66833* (2013.01); *H01L 21/0228* (2013.01); *H01L 21/02172* (2013.01);
(Continued)

(58) Field of Classification Search
CPC ......... H01L 29/66545; H01L 29/66833; H01L 21/02595; H01L 21/0228; H01L 21/02244;
(Continued)

(56) References Cited

U.S. PATENT DOCUMENTS

| 8,426,302 B2* | 4/2013 | Matsushita | ........ G11C 16/0466 |
| | | | 257/E21.192 |
| 8,841,183 B2* | 9/2014 | Ozawa | .............. H01L 27/11582 |
| | | | 438/211 |

(Continued)

FOREIGN PATENT DOCUMENTS

| CN | 101364602 A | 2/2009 |
| CN | 102498561 A1 | 6/2012 |
| CN | 104392963 A | 3/2015 |

OTHER PUBLICATIONS

International Search Report for related International Application No. PCT/CN2015/095247; report dated May 31, 2016; (6 pages).

*Primary Examiner* — Savitri Mulpuri
(74) *Attorney, Agent, or Firm* — K&L Gates LLP

(57) ABSTRACT

A semiconductor device comprise a substrate, source/drain regions, a channel region, a gate dielectric layer and a gate conductive layer, wherein the gate dielectric layer comprises a barrier layer, a storage layer, a first interface layer, a tunneling layer, a second interface layer. In accordance with the semiconductor device and the manufacturing method of the present invention, an interface layer is added between the storage layer and tunneling layer in the gate dielectric by adjusting process step, and the peak concentration and peak location of nitrogen can be flexibly adjusted, effectively improving the quality of the interface between the storage layer and the tunneling layer in the gate dielectric layer, increasing process flexibility, improving device reliability and current characteristics.

5 Claims, 3 Drawing Sheets

(51) Int. Cl.
*H01L 27/11582* (2017.01)
*H01L 27/1157* (2017.01)
*H01L 27/11568* (2017.01)

(52) U.S. Cl.
CPC .. *H01L 21/02244* (2013.01); *H01L 21/02595* (2013.01); *H01L 21/02667* (2013.01); *H01L 27/1157* (2013.01); *H01L 27/11568* (2013.01); *H01L 27/11582* (2013.01); *H01L 29/66545* (2013.01)

(58) Field of Classification Search
CPC ........... H01L 27/1157; H01L 27/11582; H01L 21/02172; H01L 21/02667
See application file for complete search history.

(56) References Cited

U.S. PATENT DOCUMENTS

| | | | |
|---|---|---|---|
| 10,483,279 B2* | 11/2019 | Ye | H01L 21/324 |
| 2010/0006923 A1* | 1/2010 | Fujitsuka | H01L 29/4234 |
| | | | 257/324 |
| 2010/0140684 A1* | 6/2010 | Ozawa | H01L 27/11582 |
| | | | 257/324 |
| 2013/0087845 A1 | 4/2013 | Yasuda | |
| 2014/0332873 A1* | 11/2014 | Yoo | H01L 27/11556 |
| | | | 257/314 |
| 2014/0367762 A1* | 12/2014 | Tian | H01L 29/66825 |
| | | | 257/321 |
| 2015/0008508 A1* | 1/2015 | Ko | H01L 29/513 |
| | | | 257/325 |
| 2016/0343657 A1* | 11/2016 | Sawa | H01L 27/11582 |
| 2017/0141201 A1* | 5/2017 | Fang | H01L 29/66825 |
| 2017/0250193 A1* | 8/2017 | Huo | H01L 21/3247 |
| 2018/0082892 A1* | 3/2018 | Lee | H01L 29/40117 |
| 2018/0269196 A1* | 9/2018 | Isogai | H01L 29/40114 |

* cited by examiner

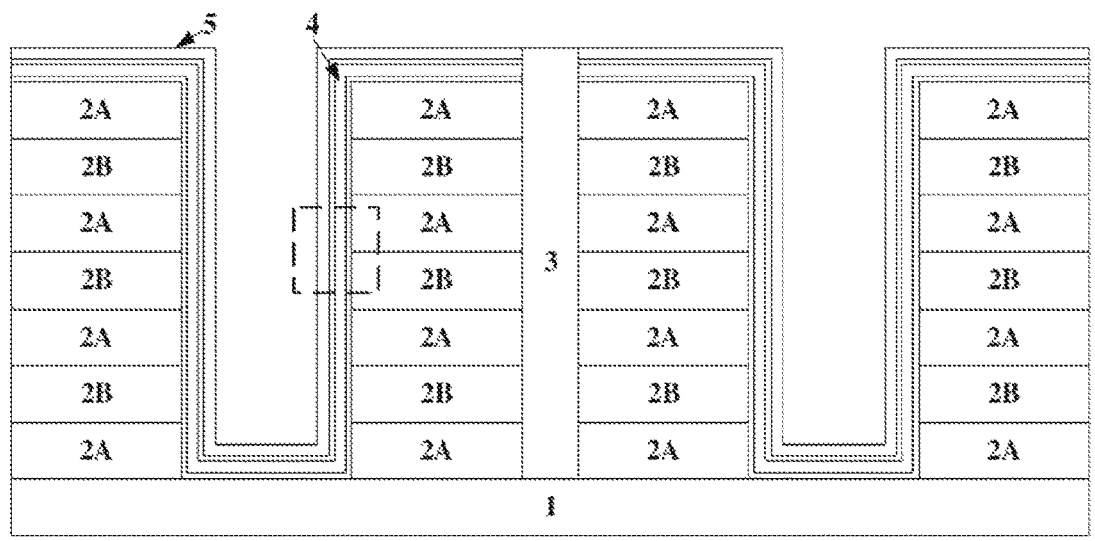
Fig. 1 (Prior Art)
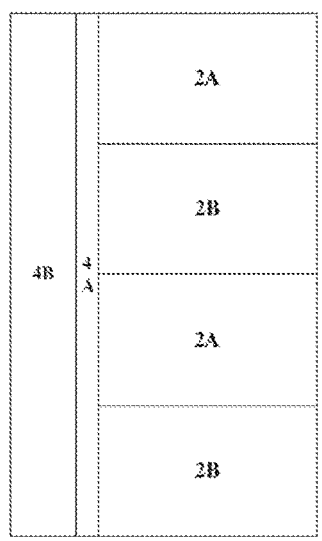 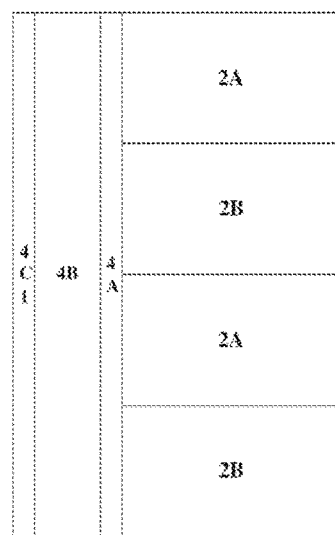 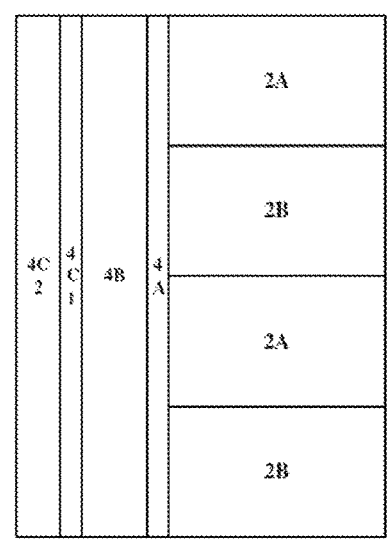
Fig. 2A (Prior Art)   Fig. 2B (Prior Art)   Fig. 2C (Prior Art)
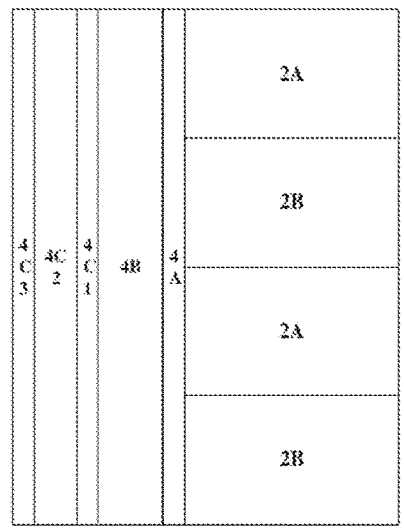 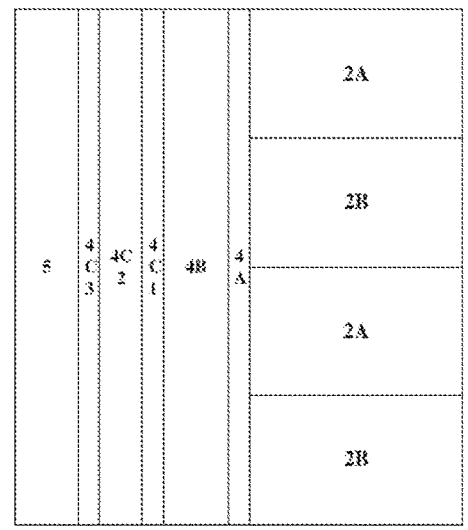
Fig. 2D (Prior Art)   Fig. 2E (Prior Art)

US 11,056,580 B2

SEMICONDUCTOR DEVICE AND MANUFACTURING METHOD THEREOF

CROSS-REFERENCE TO RELATED APPLICATIONS

The present application is a National Stage of International Application No. PCT/CN2015/095247, filed Nov. 23, 2015, which claims priority to Chinese Application No. 201510560954.2, filed Sep. 6, 2015, the disclosures of which are incorporated herein by reference.

TECHNICAL FIELD

The present invention relates to a semiconductor device and a manufacturing method thereof, particularly to a three-dimensional memory gate dielectric layer and a manufacturing method thereof.

TECHNICAL BACKGROUND

In order to improve the density of memory devices, the industry has worked extensively at developing a method for reducing the size of a two-dimensional arrangement of memory cells. As the size of the memory cells of the two-dimensional (2D) memory devices continues to shrink, signal conflict and interference significantly increase, so that it is difficult to perform operation of multi-level cell (MLC). In order to overcome the limitations of 2D memory device, the industry has developed a memory device having a three-dimensional (3D) structure, improving the integration density by arranging the memory cells over the substrate three-dimensionally.

Due to its special three-dimensional structure and complicated process inheritance, three-dimensional memories can only use polycrystalline (silicon) material as a channel instead of monocrystal (silicon). The grain size of polycrystalline (silicon) material and the number of its crystal grain boundary trap become the key to limit channel conductivity. High interface state makes the channel leakage to be larger, while the impact of temperature changes on characteristics is great.

FIG. 1 shows a typical three-dimensional memory in the prior art. Specifically, a stack of different dielectric materials 2A/2B is deposited on a substrate 1 to serve as a dummy gate stack, and then an insulating isolation layer 3 is formed by etching openings between the dummy gate stacks and filling insulating material therein. The isolation layer 3 surrounds a plurality of active regions. The dummy gate stacks in the active regions are etched to form a plurality of channel trenches, and a layer of gate dielectric 4 is deposited in the trenches. An amorphous channel layer 5, such as amorphous silicon, is conformally deposited on the gate dielectric 4, which is converted to a polycrystalline channel layer during a subsequent annealing process.

As a kind of charge trapping memory, the properties of gate dielectric is the most important part of all materials, the basic requirements include fast erase speed and good reliability characteristic. Thus, the gate dielectric layer 4 shown in FIG. 1 generally comprises at least three sub-layers-a tunneling layer adjacent to the channel layer, a storage layer over the tunneling layer for storing trapped charge, and a block layer between the storage layer and the gate/dummy gate. Being different from former method to manufacture gate dielectric by sequentially depositing tunneling layer, storage layer and block layer on the surface of single-crystal silicon channel layer, due to the complex structure of three-dimensional memories shown in FIG. 1, the change of depositing order (from channel/tunneling layer/storage layer/block layer to barrier layer/storage layer/tunneling layer/channel) and channel material(from monocrystal silicon to polysilicon) urges us to seek a new method of manufacturing gate dielectric which satisfies all of the above three basic requirements.

On the other hand, since the barrier height of valence band met during erasing operation is greater than that of electron conduction band, charge memory generally uses ONO sandwich structure as its tunneling layer. The middle layer of silicon oxynitride can effectively reduce the barrier height met by the hole tunneling during the erase operation, greatly enhancing the probability of hole tunneling and accelerating erase speed.

Thus, a prior art method of forming gate dielectric layer 4 in accordance with the configuration of FIG. 1 is particularly shown in FIG. 2A to 2E(corresponding to the dashed box shown in FIG. 1, a partial enlarged view of the structure of the vicinity of the gate dielectric layer 4). As shown in FIG. 2A, a channel groove is formed in a gate/dummy gate structure 2A/2B, and a block layer4A and a storage layer 4B are sequentially and conformally deposited on the sides and bottom of the channel groove as well as the sides of the dummy gate structure. Then as shown in FIG. 2B, a first tunneling layer 4C1 of oxide is deposited on the storage layer 4B (lateral in the view), such as silicon oxide. Subsequently as shown in FIG. 2C, a second tunneling layer 4C2 of nitrogen oxides, such as silicon oxynitride is conformally deposited on the first tunneling layer 4C1. Then as shown in FIG. 2D, a third tunneling layer 4C3 of oxide such as silicon oxide is conformally deposited on the second tunneling layer 4C2 and optionally annealed. Finally, as shown in FIG. 2E, a channel layer 5 is formed by conformally depositing an amorphous material layer on the third tunneling layer 4C3 and then annealing so as to partially crystallize it into a polycrystalline material channel layer 5, such as polysilicon. Thereby, an ONO structure tunneling layer is formed which can accelerate the speed of erasing.

However, the prior art method exists following problems. The quality of interface between the storage layer 4B and the first tunneling layer 4C1 is poor, easily leading to extra charge leakage path. Although the nitrogen concentration of the second tunneling layer 4C2 is adjustable, the peak concentration location cannot be adjusted. The quality of interface between the third tunneling 4C3 and polysilicon layer 5 is poor, easily causing a large threshold distributions and poor temperature characteristics.

SUMMARY OF THE INVENTION

From the above, the object of the present invention is to overcome the above-mentioned technical difficulties, and propose a method of manufacturing a three-dimensional memory and a manufacturing method thereof, which can effectively improve the quality of interface between storage layer and tunneling layer in the gate dielectric, increasing process flexibility and improving device reliability and current characteristics.

To this end, in one aspect of the present invention, there is provided a method of manufacturing a semiconductor device, comprising the steps of: forming a block layer and a storage layer on side surfaces of a dummy gate structure; performing oxidation and deposition processes, to form a first interface layer on the storage layer; forming a continuous tunneling layer on the first interface layer; performing annealing, forming a second interface layer on surface of the tunneling layer; and forming a channel of polycrystalline material on the second interface layer.

Wherein the block layer is a single-layer structure or a multi-layer stacked structure of materials selected from silicon oxide, aluminum oxide, hafnium oxide, or a combination thereof; optionally, the storage layer is a single layer structure or a multi-layer stack structure of materials selected from SiN, HfOx, ZrOx, YOx or a combination thereof.

Wherein the oxidation and deposition process include at least a plurality of sub-steps composed of oxidation sub-steps and deposition sub-steps alternately performed; optionally, adjusting concentration and time sequence of precursor, reducing gas, and oxidizing gas, to control the oxidation sub-steps and the deposition sub-steps.

Wherein during the step of forming the tunneling layer, changing the concentration and ratio of the gas component to adjust the ratio between the various elements.

Wherein the step of forming a channel of polycrystalline material further comprising, forming an amorphous material layer on the second interface layer, performing a second annealing to convert the amorphous material layer into polycrystalline material.

Wherein the tunneling layer is made of a high-k material and preferably nitrogen oxide; optionally, the first interface layer and/or the second interface layer is made of an oxide.

In another aspect of the invention, there is provided a semiconductor device comprising a substrate, source/drain regions, a channel region, a gate dielectric layer and a gate conductive layer, wherein the gate dielectric layer comprises a barrier layer, a storage layer, a first interface layer, a tunneling layer, and a second interface layer.

Wherein the block layer is a single-layer structure or a multi-layer stacked structure of materials selected from silicon oxide, aluminum oxide, hafnium oxide, or a combination thereof; optionally, the storage layer is a single-layer structure or a multi-layer stack structure of materials selected from SiN, HfOx, ZrOx, YOx or a combination thereof; optionally, the tunneling layer is mad of a high-k material and preferably nitrogen oxide; optionally, the first interface layer and/or the second interface layer is made of an oxide.

Wherein the thickness of the storage layer is 2~15 nm; optionally, the thickness of the first interface layer and/or the second interface layer is 1 nm; optionally, the thickness of the tunneling layer is 2~8 nm.

Wherein the relative proportions of the respective elements in the tunneling layer is continuously adjustable.

In accordance with the semiconductor device and the manufacturing method of the present invention, the process is improved that an interface layer is added between the storage layer and the tunneling layer in the gate dielectric, and both of the nitrogen peak concentration and its location can be flexibly adjusted, effectively improving the quality of the interface between the storage layer and the tunneling layer in the gate dielectric layer, increasing process flexibility, improving device reliability and current characteristics.

BRIEF DESCRIPTION

The technical solutions of the present invention are described in detail below with reference to the accompanying drawings, in which:

FIG. 1 is a cross-sectional view of a three-dimensional memory device of the prior art;

FIGS. 2A to 2E are cross-sectional views of each step in the manufacturing method of the gate dielectric layer of the device shown in FIG. 1;

DETAILED DESCRIPTION

Figure 3A:
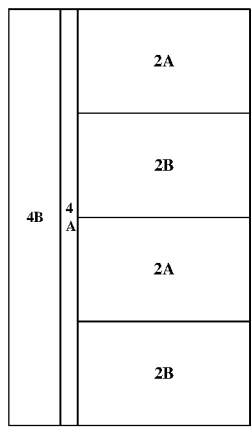
FIGS. 3A to 3E are cross-sectional views of various steps of a method of manufacturing a gate dielectric according to the present invention.

The features and technical effects of the present invention will be described in detail with reference to the drawings and schematic embodiments, disclosing a manufacturing method of 3D memory device for effectively improving the quality of interface between sub-layers of gate dielectric. It should be noted that the similar reference numbers denote the similar structure. The terms used in the present invention like "first", "second", "up/upon", "down/low/beneath/under" etc. can be used in denoting various device structures, and do not indicate the relationship in space, sequence or hierarchy of the device structures unless specially illuminated these terms, if not stated otherwise.

Firstly, as shown in FIG. 1, a basic structure is formed.

A stacked structure 2 composed of a plurality of first material layers 2A and a plurality of second material layers 2B is formed alternately on a substrate 1. The material of substrate 1 may comprise a bulk silicon (bulk Si), bulk germanium (bulk Ge), silicon-on-insulator (SOI), germanium-on-insulator (GeOI), or other compound semiconductor substrate, e.g., SiGe, SiC, GaN, GaAs, InP and the like, and combinations of these substances. For compatibility with the existing IC fabrication process, the substrate 1 is preferably a substrate containing silicon material, e.g., Si, SOI, SiGe, Si:C and the like. The material of the stacked structure 2 is selected from combinations of the following materials and comprises at least one insulating dielectric: e.g. silicon oxide, silicon nitride, amorphous carbon, amorphous diamond-like carbon (DLC), germanium oxide, aluminum oxide, or the like and combinations thereof. The first material layers 2A have a first etch selectivity, and the second material layers 2B have a second etch selectivity which is different from the first etch selectivity (e.g. the etch selectivity ratio between the two materials is greater than 5:1 and preferably greater than 10:1). In a preferred embodiment of the present invention, the stacked structures 2A/2B is of non-conductive material, and the combination of the layers 2A/2B is for example silicon oxide and silicon nitride, silicon oxide and (non-doped) polysilicon or amorphous silicon, silicon oxide or silicon nitride and amorphous carbon, and the like. In a preferred embodiment of the invention, the layers 2A have a relatively greater etching selectivity ratio (for example greater than 5:1) to layers 2B under wet etching conditions or oxygen plasma dry etching conditions. The method for depositing layers 2A, 2B comprises PECVD, LPCVD, HDPCVD, MOCVD, MBE, ALD, thermal oxidation, evaporation, sputtering, and other processes. In an optimized embodiment of the invention, layers 2A are of silicon dioxide and layers 2B are of silicon nitride.

The stacked structure (of dummy gate) 2 is etched in the array region until the substrate 1 is exposed, a plurality of dummy gate openings (or refer to as first openings) are formed and a filling layer 3 is formed therein (the substrate under the filling layer 3 will constitute a plurality of common source regions formed later). Preferably, the stacked structure 2 comprised of layers 2A/2B is anisotropically etched by RIE or plasma dry etching to form openings exposing the substrate 1 and sidewalls of the layers 2A/2B alternately stacked on the substrate 1 (not shown). The etching gas is, for example, a fluorocarbon-based etching gas against to materials such as silicon dioxide and silicon nitride, and forms a plurality of temporary protective spacers formed of a C-containing polymer on the sidewalls by increasing the ratio of carbon to fluorine, finally obtaining better vertical side walls. In a preferred embodiment of the present invention, the etching gas is preferably a gas containing a relatively high amount of C, such as C3F6, C4F8, and further preferably, the side wall morphology is controlled by adding oxidizing gases such as O2,CO. The cross-sectional shapes of the openings or trenches cut parallel to the surface of the substrate 1 may be various geometry such as rectangular, square, diamond, circle, semicircle, oval, triangle, pentagon, pentagon, hexagon, octagon, etc. Geometric shapes. The deposition method of the filling layer 3 includes PECVD, HDPCVD, MOCVD, MBE, ALD, evaporation, sputtering and the like. The material of filling layer 3 is preferably a material having high selectivity with respect to the layers 2A and 2B of the stacked structure 2, for instance, the etching selectivity ratio between every two of the three layers 3, 2A, 2B is greater than or equal to 5:1. In a preferred embodiment of the present invention, layers 2A are of silicon oxide, layers 2B are of silicon nitride, and filler layer 3 is of amorphous germanium, amorphous carbon, DLC, silicon oxynitride and the like, and vice versa.

Next, the stacked structure 2 of the layers 2A/2B is anisotropically etched by RIE or plasma dry etching, similar to the process of etching to form the first openings, and a plurality of second openings are formed around the first openings, which expose the substrate 1 and the sidewalls of the layers 2A/2B alternately stacked on the substrate 1. The etching gas is, for example, a fluorocarbon-based etching gas against materials such as silicon dioxide and silicon nitride. A plurality of temporary protective spacers of C-containing polymer are formed on the sidewalls by increasing the ratio of carbon to fluorine, finally obtaining better vertical sidewall. In a preferred embodiment of the present invention, the etching gas preferably contains a relatively high amount of C, such as C3F6, C4F8, and further preferably, the sidewall morphology is controlled by adding oxidizing gases such as O2 and CO. In a preferred embodiment of the invention, the size (e.g., diameter) of the first openings for exposing the common source regions is greater than or equal to the size of the second openings for forming the channel regions, for example the ratio of the two dimensions (the ratio of the diameter or the maximum span of the polygons), is greater than 1.5 and preferably greater than or equal to 2. In one embodiment of the present invention, there are six second openings around each of the first openings in order to improve the efficiency and uniformity of the later lateral etching of layers 2B.

Figure 4:
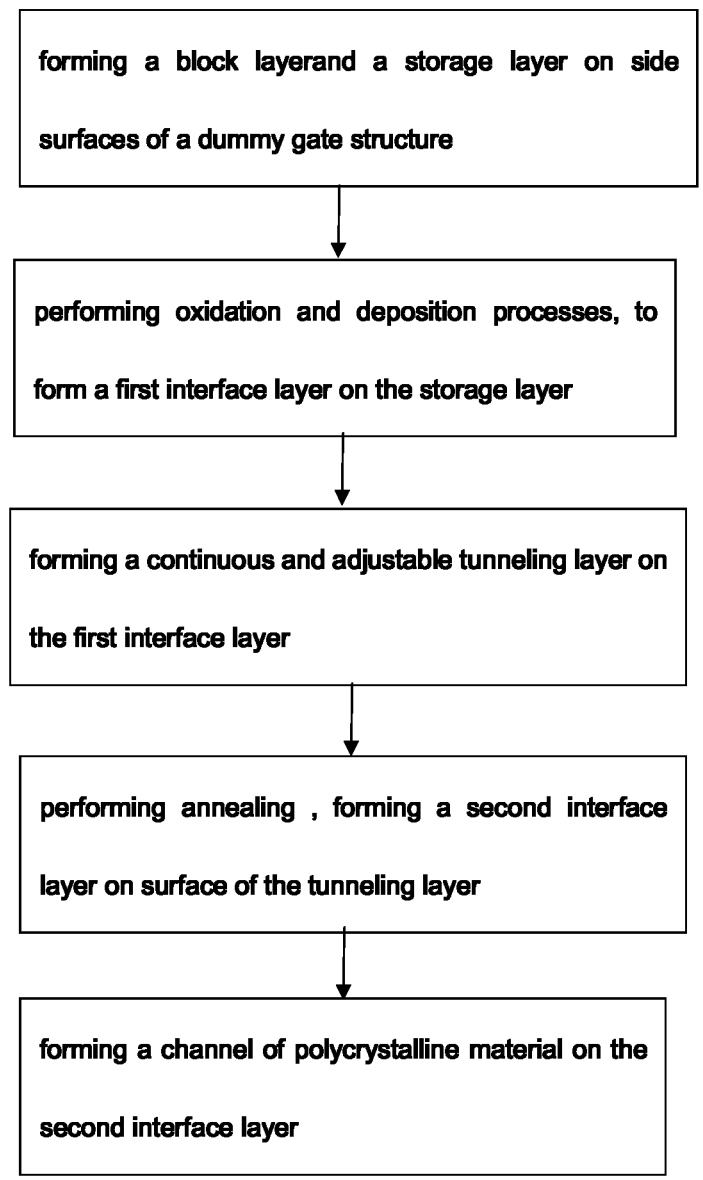
FIG. 4 is a schematic flowchart of a method for producing a three-dimensional memory device of the invention.

Subsequently, as shown in FIG. 4 and FIG. 3A, a block layer4A and a storage layer 4B are conformally and sequentially formed on the sidewalls of dummy gate structures 2A/2B and top of the exposed substrate 1 in the second openings. The deposition method includes PECVD, HDPCVD, MOCVD, MBE, ALD, evaporation, sputtering and the like. The block layer may be a single-layer structure or a multi-layer stacked structure of dielectric materials such as silicon oxide, aluminum oxide, hafnium oxide, or the like. The storage layer 4B is of a dielectric material having charge trapping capability, such as SiN, HfOx, ZrOx, YOx, and the like, or a combination thereof, and may also be a single-layer structure or a multi-layer stack structure of the above materials. The thickness of storage layer 4B is 2~15 nm.

Figure 3B:
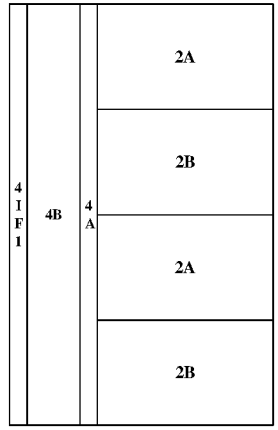

As shown in FIG. 4 and FIG. 3B, a first interface layer 4IF1 is conformally formed on the storage layer 4B, situated on sidewalls and bottoms of the second openings. Being different from solely depositing the first tunneling layer 4C1 in the prior art as shown in FIG. 2A~2E, the present application uses simultaneous deposition and oxidation process to form a high quality interface layer. Deposition methods include PECVD, HDPCVD, MOCVD, MBE, ALD, evaporation, sputtering or the like. Specifically, the concentration and time sequence of active gases, for example, including a precursor (e.g., silane, germane, TEOS, etc.), reducing gases(such as hydrogen, ammonia, CO), oxidizing gases (e.g. oxygen, ozone, CO2, N2O) and etc are controlled, and the oxidation+deposition processes are performed simultaneously on the surface of storage layer 4B, thereby forming an interface layer 4IF1 with thickness of about 1nm, to act as a high quality interface layer between the storage layer 4B and tunneling layer 4C. In particular, in one embodiment of the present invention, the fabricate process of interface layer 4IF1 includes a plurality of deposition sub-steps and oxidation sub-steps alternately and circularly performed. For example, firstly increasing the ratio of first precursor to oxidizing gas during the deposition sub-step to increase depositing speed of e.g. silicon oxide, then optionally decreasing the proportion or removing oxidizing gas and increasing the proportion of reducing gas to eliminate the dangling bond of the semiconductor material such as silicon, germanium, etc., secondly reducing the proportion of the precursor and increasing the proportion of oxidizing gas during the oxidation sub-step to re-link bonds connection between the semiconductor material such as Si and O, thereby timely adjusting the quality of the interface layer during the layer by layer oxidation and deposition processes in level of angstrom, obtaining a high-quality interface layer 4IF1 in level of nanometers, for example, its thickness is 1 nm. Further, in another embodiment of the present invention, the sequence of three sub-processes can be alternately and circularly performed as follows: firstly increasing the proportion of the reducing gas to reduce dangling bonds, secondly increasing the proportion of the precursor to increase deposition speed, and finally increasing the proportion of the oxidizing gas to increase the compactness of the oxide film. Or other process sequence can also be used.

Figure 3C:
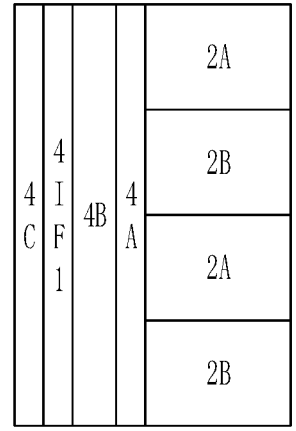

As shown in FIG. 4 and FIG. 3C, a tunneling layer 4C is continuously and conformally formed on the first interface layer 4IF1. Deposition method is preferably ALD. The tunneling layer is formed by changing the concentration and the ratio of gas composition to continuously deposit a high-K material, wherein the content of non-oxygen elements in the tunneling layer 4C is continuously adjustable. The high-k materials include, but are not limited to nitride (e.g. SiN, SiON, AlN, TiN), metal oxides (mainly sub-group metals and lanthanoid oxides such as MgO, Al2O3, Ta2O5, TiO2, ZnO, ZrO2, HfO2, CeO2, Y2O3, La2O3), oxynitrides (e.g., HfSiON), perovskite oxides (such as PbZrxTi1-xO3 (PZT), BaxSr1-xTiO3 (BST)), and the like. The tunneling layer may be a single-layer structure or a multi-layer stacked structure of the above materials. In a preferred embodiment of the present invention, the tunneling layer 4C is made of oxynitrides, such as silicon oxynitride, and the peak concentration and position of nitrogen element in silicon oxynitride is adjusted by continuously adjusting the concentration and the ratio of gas composition, thus increasing the process flexibility. In other embodiments of the present invention, the concentration and the ratio of gas composition are adjusted in order to adjust the ratio of metal element or N element to O element, such as adjust the peak concentration and peak location. For example, the thickness of the tunneling layer is 2~8 nm.

Figure 3D:
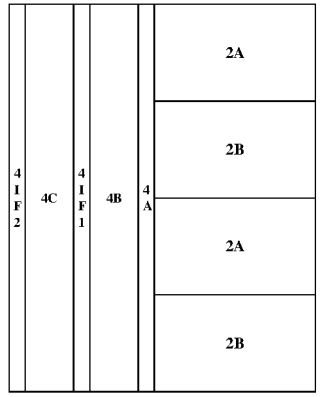

As shown in FIG. 4 and FIG. 3D, a process of annealing is performed, so that the surface elements of the tunneling layer 4C are re-distributed, to form a second interface layer 4IF2 on the surface of tunneling layer 4C. The annealing temperature is e.g. 500~1000° C., and the annealing time is for example 1 minute~10 hours. During this process, the chemical bonds (e.g. Si—O or Si—N bonds) on the surface of tunneling layer 4C are broken by heat treatment of annealing, so that each of the elements is re-bound in accordance with its bond energy. Some of the bonds on the surface of tunneling layer 4C such as Si—O bonds take advantage by controlling the annealing temperature and time to recombine to form a second interface layer 4IF2 made of e.g. silicon oxide. The thickness of the second interface layer 4IF2 is for example only 1 nm.

Figure 3E:
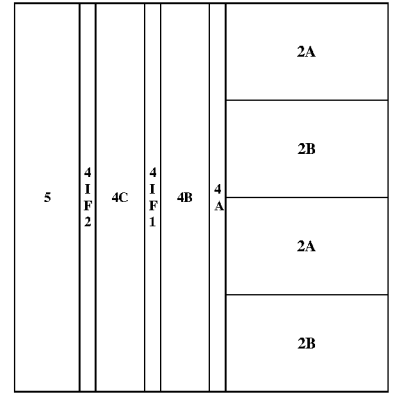

As shown in FIG. 4 and FIG. 3E, a channel layer 5 of polycrystalline material is formed on the second interface layer by depositing a layer of amorphous material and then annealing, the thickness of channel layer 5 is for example 5~100 nm. The amorphous materials are such as amorphous silicon, amorphous germanium, and the deposition process comprises LPCVD, PECVD, HDPCVD, MOCVD, MBE, ALD and the like. In one embodiment of the present invention, the method for depositing a layer of amorphous material is partially filling the sidewalls of the second openings (the two openings at left and right sides in FIG. 1) to form a plurality of hollow cylinders with an air gap in each. In other embodiments of the present invention, the deposition process of the amorphous channel layer is selected to completely or partially fill in the second openings to form a plurality of solid pillars, hollow rings, or core-shell structures comprised of hollow rings filled with an insulating layer (not shown). The shape of the horizontal cross-section of the amorphous channel layer is similar to and preferably conformal to that of the second openings, and may be various geometry such as solid rectangle, square, diamond, circle, semicircle, ellipse, triangle, pentagonal, hexagonal, octagonal, etc., or a hollow ring-shaped, barrel-like structure (and the inside of which may be filled with an insulating layer) evolved from the above geometrical shapes. For example, the annealing temperature is 300~850° C., and the grain size of channel layer is controlled by a low temperature process, thus reducing the leakage current. The annealing time is, for example, 1 minute~10 hours. Finally, the gate dielectric layer 4 sequentially include the block layer 4A, the storage layer 4B, the first interface layer 4IF1, the tunneling layer 4C, the second interface layer 4IF2 in the direction from the dummy gate structure 2A/2B to the channel layer 5, wherein each of the sub-layers is conformally deposited and distributed, i.e. distributed on the sidewalls and on the bottom of the second openings.

Hereafter, a plurality of subsequent processes may be further performed to complete the device manufacturing.

For example, an insulating isolation layer (not shown) is filled inside the channel layer 5, for instance, a silicon oxide layer is formed by processes such as LPCVD, PECVD and HDPCVD to support, insulate and isolate the channel layer 5. After that, a plurality of drain contacts are deposited on top of the channel layer 5. Preferably, a material of same or similar as that of the channel layer 5 (for example, SiGe, SiC or the like which are similar to Si for fine tuning the lattice constant to improve carrier mobility in order to control the driving performance of the device) is deposited on top of the second openings to form drain regions of the memory cell unit transistors, and a silicide (not shown) may be further formed to reduce the contact resistance.

The filling layer 3 is removed by selective etching to expose the first openings again, and the second material layers (dummy gate layers) 2B in the stacked structure are removed by lateral etching through the first openings. In one embodiment of the invention, using an isotropic dry etch process, layers 2B are removed by lateral etching, leaving a plurality of lateral recesses between layers 2A. For instance, the ratio of carbon to fluorine is reduced in order to laterally etch layers 2B of silicon nitride, or hot phosphoric acid is used to etch layers 2B of silicon nitride. Alternatively, when layers 2A are of silicon nitride and layers 2B are of silicon oxide, an HF-based etching solution may be used to etch layers 2B.

A plurality of common source regions are formed at the bottom of the first openings, and a plurality of gate conductive layers (not shown) are formed in the recesses. The source regions may be formed by ion implantation doping, and preferably further forming a metal silicide (not shown) on the surface. The material of metal silicide is, for example, $NiSi_2$-y, $Ni_{1-x}Pt_xSi_2$-y, $CoSi_2$-y or $Ni_{1-x}Co_xSi_2$-y, wherein x is greater than 0 and less than 1, and y is greater than or equal to 0 and less than 1, respectively. The gate conductive layers may be of polysilicon, poly-SiGe, or metal, wherein the metal may include Co, Ni, Cu, Al, Pd, Pt, Ru, Re, Mo, Ta, Ti, Hf, Zr, W, Ir, Eu, Nd, Er, La, etc., alloys of these metals, and nitrides of these metals. Elements such as C, F, N, O, B, P and As may also be doped in the gate conductive layers to adjust work function. A plurality of barrier layers (not shown) of nitride are also preferably formed between the gate insulating layer 4 and the gate conductive layers by conventional methods such as PVD, CVD, ALD, and the like, and the material of the block layer is $M_xN_y$, $M_xSi_yN_z$, $M_xAl_yN_z$, and $M_aAl_xSi_yN_z$, where M is Ta, Ti, Hf, Zr, Mo, W or other elements. Likewise, the gate conductive layers may be a single-layer structure or a multi-layer stacked structure. After that, a plurality of source and drain contacts and interlayer dielectric layers are formed, completing the contacts and interconnects of the device.

In accordance with the semiconductor device and the manufacturing method of the present invention, an interface layer is added between the storage layer and tunneling layer of the gate dielectric layer by adjusting some steps of the process, while the peak concentration and peak location of nitrogen can be flexibly adjusted, effectively improving the quality of the interface between the storage layer and the tunneling layer of the gate dielectric layer, increasing process flexibility, improving device reliability and current characteristics.

Although reference to one or more exemplary embodiments illustrate the present invention, those skilled in the art can know without departing from the scope of the invention and that various modifications and equivalents suitable for the device structure or process flow. Further, the teachings disclosed may be adapted to many modifications may be made to a particular situation or material without departing from the scope of the invention. Accordingly, an object of the present invention is not limited to the embodiments in particular embodiments as the best modes for carrying out the present invention are disclosed, and the device structure and the manufacturing method disclosed herein will include all embodiments falling within the scope of the present invention.

The invention claimed is:

1. A method of manufacturing a semiconductor device, comprising the steps of:
   forming a block layer and a storage layer on side surfaces of a dummy gate structure;
   performing oxidation and deposition processes, to form a first interface layer on the storage layer, wherein, the oxidation and deposition processes include at least a plurality of oxidation sub-steps and deposition sub steps alternately performed; and optionally, adjusting a concentration and time sequence of a precursor, reducing gas, and oxidizing gas, to control the oxidation sub-steps and the deposition sub-steps;
   forming a continuous, single-layer tunneling layer on the first interface layer by periodically adjusting a concentration or content ratio of a gas composition containing non-oxygen elements;
   performing annealing to break chemical bonds between elements on a surface of the tunneling layer so that each of the elements is re-bound in accordance with its bond energy to form a second interface layer on a surface of the tunneling layer, wherein during the annealing, a temperature is controlled over time such that the surface elements re-distribute and recombine to form silicon oxide in the second interface layer, wherein the tunneling layer is made of a high-k material and preferably nitrogen oxide; and optionally, the first interface layer and/or the second interface layer is made of oxide; and
   forming a channel of polycrystalline material on the second interface layer, wherein, the step of forming the channel of polycrystalline material further comprises forming an amorphous material layer on the second interface layer and performing a second annealing to convert the amorphous material layer into the channel of poly crystalline material.

2. The method according to claim 1, wherein the block layer includes at least one of a single-layer structure or a multi-layer stacked structure of materials selected from silicon oxide, aluminum oxide, hafnium oxide, or a combination thereof; and optionally, the storage layer is a single layer structure or a multi-layer stacked structure of materials selected from SiN, HfOx, ZrOx, YOx or a combination thereof.

3. The method according to claim 1, which includes during the step of forming the tunneling layer, changing the concentration or the content ratio of a gas component of the gas composition to adjust the content ratio between the non-oxygen elements.

4. The method according to claim 1, wherein the tunneling layer is formed to have a thickness between 2 to 8 nanometers and the second interface layer is formed to have a thickness of 1 nanometer.

5. The method according to claim 1, which includes during the step of forming the tunneling layer, adjusting at least one of a peak concentration or peak location of nitrogen.

* * * * *